US010019023B2

(12) United States Patent
Ming et al.

(10) Patent No.: US 10,019,023 B2
(45) Date of Patent: Jul. 10, 2018

(54) LOW-DROPOUT LINEAR REGULATOR WITH SUPER TRANSCONDUCTANCE STRUCTURE

(71) Applicant: University of Electronic Science and Technology of China, Chengdu (CN)

(72) Inventors: Xin Ming, Chengdu (CN); Di Gao, Chengdu (CN); Jiahao Zhang, Chengdu (CN); Xuan Zhang, Chengdu (CN); Xiuling Wei, Chengdu (CN); Yao Wang, Chengdu (CN); Zhuo Wang, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 15/690,290

(22) Filed: Aug. 30, 2017

(65) Prior Publication Data
US 2018/0157283 A1 Jun. 7, 2018

(30) Foreign Application Priority Data

Dec. 5, 2016 (CN) .......................... 2016 1 1103172

(51) Int. Cl.
*G05F 1/575* (2006.01)
*H03F 3/45* (2006.01)
(52) U.S. Cl.
CPC ........... *G05F 1/575* (2013.01); *H03F 3/4521* (2013.01); *H03F 2203/45288* (2013.01)

(58) Field of Classification Search
CPC . G05F 1/56; G05F 1/565; G05F 1/573; G05F 1/575; H02M 1/44
USPC .................................. 323/273, 274, 277, 280
See application file for complete search history.

(56) References Cited

U.S. PATENT DOCUMENTS

| 6,246,221 | B1* | 6/2001 | Xi ........................... | G05F 1/575 |
| | | | | 323/280 |
| 6,710,583 | B2* | 3/2004 | Stanescu ................. | G05F 1/575 |
| | | | | 323/280 |
| 7,843,180 | B1* | 11/2010 | Cilingiroglu ........... | G05F 1/575 |
| | | | | 323/273 |

(Continued)

*Primary Examiner* — Yemane Mehari
(74) *Attorney, Agent, or Firm* — Gokalp Bayramoglu

(57) ABSTRACT

A low-dropout regulator with super transconductance structure relates to the field of power management technology. The super-transconductance structure refers to the circuit structure in which the voltage signal is converted into a current signal and amplified with a high magnification. The error amplifier EA in the present invention uses the super transconductance structure. The differential input pair of the error amplifier EA samples the difference between the feedback voltage $V_{FB}$ and the dynamic reference voltage $V_{REF1}$. The difference is converted into a small signal current, which goes through a first-stage of current mirror to be amplified by $K_1$, and through a second-stage of current mirror to be amplified by $K_2$. The amplified signal is used to regulate the gate of the adjustment transistor MP. The error amplifier EA with the super transconductance structure is used to expand the bandwidth of the error amplifier EA.

2 Claims, 5 Drawing Sheets

(56) References Cited

U.S. PATENT DOCUMENTS

2015/0227147 A1* 8/2015 Ivanov .................... G05F 1/575
323/280

* cited by examiner

LOW-DROPOUT LINEAR REGULATOR WITH SUPER TRANSCONDUCTANCE STRUCTURE

CROSS REFERENCE

The present application is based on and claims priority from Chinese patent application 201611103172.7, filed on Dec. 5, 2016, the disclosure of which is hereby incorporated by reference in its entirety.

TECHNICAL FIELD

The present invention relates to the technical field of power management technology, and in particular to the design of a low dropout linear regulator (LDO).

BACKGROUND

Low dropout linear regulator (LDO) has the characteristics of low power consumption, low noise, and small footprint on the chip, etc. LDO has been widely used in mobile electronic equipment.

Typical LDO architecture is shown in FIG. 1, comprising: an error amplifier EA, an adjustment transistor $M_P$, a resistor divider feedback network comprising $R_{F1}$ and $R_{F2}$, a load current $I_{load}$, an output capacitor $C_{load}$ (wherein $R_{ESR}$ represents the output capacitor's equivalent series resistor). The basic working principle is: the resistance feedback network generates a feedback voltage through the resistor divider. The error amplifier amplifies the error between a reference voltage and the feedback voltage to control the gate voltage of the adjustment transistor. The adjustment transistor is used to adjust an output voltage. The whole network forms a negative feedback structure, so that the output voltage is stable. Due to the clamping effect of the error amplifier, the reference voltage $V_{REF}$ and the contact voltages $V_{FB}$ of $R_{F1}$ and $R_{F2}$ are equal. Thus, the following formula is satisfied:

$$V_{OUT}=V_{REF}\cdot(1+R_{F1}/R_{F2}).$$

The transient response of the LDO is the indicator of the LDO loop adjustment speed when transient changes of the load current $I_{load}$ occur. The transient response of the LDO is limited by both the loop bandwidth limit and the output slew rate of the EA, while in the LDO, the output slew rate of the EA is typically determined by the EA output capacitor $C_{PAR}$ (i.e., the parasitic gate capacitance of the power transistor) and the large signal output current of the EA, that is the slew rate current $I_{SR}$, satisfying the formula: $SR=I_{SR}/C_{PAR}$. When the load current $I_{load}$ suddenly increases, the current of the adjustment transistor remains unchanged, so that the $V_{OUT}$ suddenly drops. The resistance feedback network feeds the change amount to the EA. Since the reference voltage is constant, the output voltage of the EA drops, so that the $|V_{GS}|$ of the adjustment transistor $M_P$ decreases. The current of $M_P$ decreases until it equals to the load current. The $V_{OUT}$ restores stability. Throughout the loop adjustment, the response speed of the EA is limited by its unity gain bandwidth. Since the gate of $M_P$ has a large parasitic capacitance $C_{PAR}$, changing the gate voltage of $M_P$ needs a large EA output current $I_{SR}$ to charge and discharge the gate, namely, the slew rate limit. The selection of the size of $M_P$ needs to guarantee the passing of the maximum load current. Thus, the size is usually very large, resulting in a large parasitic gate capacitance. While introducing the ultra-low frequency poles and limiting the bandwidth of the EA, the slew rate of EA output is limited. In order to achieve high gain and low power consumption, a smaller bias current will be selected for the EA with the traditional structure, which will lead to a larger output impedance of the EA. The poles will be pushed towards the low frequency. The EA bandwidth will be limited. In addition, since the current of the output SR is insufficient, the output of the slew rate is limited. Therefore, the LDO transient response of the general structure is limited by the maximum load current, loop gain, and static power consumption.

SUMMARY OF INVENTION

Regarding the above deficiencies, the present invention provides a low-dropout regulator with super transconductance structure. Using the error amplifier EA with super transconductance structure, the bandwidth of the error amplifier EA is expanded. In addition, the SR current of the EA output is increased by the dynamic bias technology and the dynamic reference control (DRC) technology. Thus, the purpose of increasing the slew rate and enhancing the transient response can be achieved.

The technical solutions of the present invention are listed below.

A low-dropout regulator with super transconductance structure comprises:

A resistor feedback network comprises a first feedback resistor and a second feedback resistor connected in series. A voltage of the series point is a feedback voltage. Another end of the first feedback resistor is connected to an output terminal, another end of the second feedback resistor is grounded.

An error amplifier is a transconductance amplifier using a super transconductance structure. An input pair transistor of the error amplifier is composed of a first NMOS transistor and a second NMOS transistor. Gates of the first NMOS transistor and the second NMOS transistor serve as an input port of the error amplifier, the gate of the first NMOS transistor is connected to the feedback voltage generated by the resistor feedback network.

An adjustment transistor is the power transistor. A drain of the adjustment transistor is connected to the output terminal. A source of the adjustment transistor is connected to a power supply, and a gate of the adjustment transistor is connected to an output terminal of the error amplifier.

A dynamic reference control module for sampling internal current changes of the error amplifier and exports a dynamic reference voltage to the gate of the second NMOS transistor in the error amplifier.

A compensation capacitor is connected in parallel to the first feedback resistor.

A load current source is connected between a drain of the adjustment transistor and ground.

An output capacitor and its equivalent resistor are connected in series. One end of the output capacitor is grounded, and the other end is connected to the drain of the adjustment transistor through the equivalent resistor.

Particularly, the error amplifier EA further comprises:

A first PMOS transistor and a second PMOS transistor, a sixth PMOS transistor and a seventh PMOS transistor form the first-stage current mirror. The amplification factor of the first-stage current mirror is $K_1$. A drain of the first PMOS transistor is connected to a drain of the first NMOS transistor, and their gates are connected together. Sources of the first PMOS transistor and the second PMOS transistor are both connected to the power supply. A drain of the sixth PMOS transistor is connected to a drain of the second NMOS transistor. Gates of the sixth PMOS transistor and the seventh PMOS transistor are connected together. Sources of the sixth PMOS transistor and the seventh PMOS transistor are both connected to the power supply.

A fourth PMOS transistor and a fifth PMOS transistor, a ninth PMOS transistor and a tenth PMOS transistor form the second-stage current mirror. The amplification factor of the second current mirror is $K_2$. A drain of the second PMOS transistor is connected to a drain of the fourth PMOS transistor. A gate and a source of the fourth PMOS are connected together to a gate of the fifth PMOS, a source of the fifth PMOS transistor is connected to the power supply. A drain of the seventh PMOS transistor is connected to a drain of the ninth PMOS transistor. A gate and a drain of the ninth PMOS transistor are connected together and to a gate of the tenth PMOS transistor. A source of the tenth PMOS transistor is connected to the power supply.

A third NMOS transistor and a fourth NMOS transistor form a current mirror. A drain of the fifth PMOS transistor is connected to a drain of the third NMOS transistor. A drain and a gate of the third NMOS transistor are connected together to a gate of the fourth NMOS. A drain of the fourth NMOS transistor is connected to a drain of the tenth PMOS transistor and serve as the output terminal of the error amplifier. Sources of the third NMOS transistor and the fourth NMOS transistor are grounded.

The first PMOS transistor, the second PMOS transistor, a third PMOS transistor, and a first resistor form a first new type of broad-bandwidth current amplifier. The sixth PMOS transistor, the seventh PMOS transistor, an eighth PMOS transistor, and a second resistor form another first new type of broad-bandwidth current amplifier. A gate of the third PMOS transistor is connected to a drain of the first PMOS transistor. A gate of the eighth PMOS transistor is connected to a drain of the sixth PMOS transistor. A source of the third PMOS transistor is connected to a gate of the first PMOS transistor. A source of the eighth PMOS transistor is connected to a gate of the sixth PMOS transistor. Drains of the third PMOS transistor and the eighth PMOS transistor are grounded. The first resistor is connected between a source of the third PMOS transistor and the power supply. The second resistor is connected between a source of the eighth PMOS transistor and the power supply.

A third resistor, a fourth PMOS transistor, and a fifth PMOS transistor form a second new type of high bandwidth current amplifier. A fourth resistor, a ninth PMOS transistor, and a tenth PMOS transistor also form another second new type of broad-bandwidth current amplifier. The third resistor is connected between the power supply and a source of the fourth PMOS transistor. The fourth resistor is connected between the power supply and a source of the ninth PMOS transistor.

The first NMOS transistor, the second NMOS transistor, a fifth NMOS transistor, an eleventh PMOS transistor, a sixth NMOS transistor, a seventh NMOS transistor, a twelfth PMOS transistor, an eighth NMOS transistor, a ninth NMOS transistor, and a tenth NMOS transistor form a dynamic bias structure. A gate of the sixth NMOS transistor is connected to the feedback voltage. A gate of the eighth NMOS transistor is connected to the dynamic reference voltage. Sources of the sixth NMOS transistor and the second NMOS transistor are connected to a drain of the seventh NMOS transistor. Sources of the eighth NMOS transistor and the first NMOS transistor are connected to a drain of the ninth NMOS transistor. The seventh NMOS transistor and the ninth NMOS transistor form a current mirror. Sources of the seventh NMOS transistor and the ninth NMOS transistor are grounded. A gate of the seventh NMOS transistor is connected to a drain of the eleventh PMOS transistor, a drain of the sixth NMOS, and a gate of the fifth NMOS transistor. A gate of the ninth NMOS transistor is connected to a drain of the twelfth PMOS transistor, a drain of the eighth NMOS transistor, and a gate of the tenth NMOS transistor. Drains of the fifth NMOS transistor and the tenth NMOS transistor are respectively connected to drains of the second PMOS transistor and the seventh PMOS transistor. Sources of the fifth NMOS transistor and the tenth NMOS transistor are grounded. Sources of the eleventh PMOS transistor and the twelfth PMOS transistor are connected to the power supply. Gates of the eleventh PMOS transistor and the twelfth PMOS transistor are connected to the bias voltage.

Particularly, the dynamic reference control module comprises a thirteenth PMOS transistor, a fourteenth PMOS transistor, an eleventh NMOS transistor, a twelfth NMOS transistor, and a fifth resistor. The eleventh NMOS transistor and the twelfth NMOS transistor form a current mirror. Drains of the eleventh NMOS transistor and the twelfth NMOS transistor are respectively connected to drains of the thirteenth PMOS transistor and the fourteenth PMOS transistor. A drain and a gate of the eleventh NMOS transistor are connected together to a gate of the twelfth NMOS transistor. Sources of the eleventh NMOS transistor and the twelfth NMOS transistor are grounded. The thirteenth PMOS transistor and the fourteenth PMOS transistor, the first PMOS transistor and the sixth NMOS transistor form two current mirrors. Gates of the thirteenth PMOS transistor and the fourteenth PMOS transistor are connected to gates of the first PMOS transistor and the sixth NMOS transistor respectively. Sources of the thirteenth PMOS transistor and the fourteenth PMOS transistor are connected to the power supply. A drain of the fourteenth PMOS transistor serves as an output of the dynamic reference control module and outputs the dynamic reference voltage. The drain of the fourteenth PMOS transistor is connected to the gate of second NMOS transistor, the gate of the eighth NMOS transistor, and the reference voltage via the fifth resistor.

The super-transconductance structure refers to the circuit structure in which the voltage signal is converted into a current signal and amplified with a high magnification. The differential input pair of the error amplifier EA samples the difference between the feedback voltage $V_{FB}$ and the dynamic reference voltage $V_{REF1}$. The difference is converted into a small signal current, which goes through a first-stage of current mirror to be amplified by $K_1$, and through a second-stage of current mirror to be amplified by $K_2$. The amplified signal is used to regulate the gate of the adjustment transistor MP.

The advantages of the present invention are as follows. The error amplifier uses the super transconductance structure. By increasing the transconductance, the gain of the loop is increased without introducing low-frequency zero or pole. Thus, the bandwidth of the error amplifier is expanded. Two new types of high bandwidth current amplifiers are provided. While the current gain is ensured, only poles of higher-frequency are introduced. Therefore, additional low-frequency poles introduced by the super transconductance structure can be avoided. Accordingly, the problem of stability is solved. Moreover, the dynamic bias technology and the dynamic reference control (DRC) technology are used to increase the SR current output by the error amplifier EA during the transient change of the load. Thus, the purpose of increasing the slew rate and improving the transient response of the error amplifier can be achieved.

DETAILED DESCRIPTION OF THE EMBODIMENTS

Hereinafter, embodiments and principles of the present invention will be further illustrated with reference to the drawings.

The main structure of the error amplifier EA of the present invention employs a transconductance amplifier of a super transconductance structure. The voltage signal is transformed into a current signal to pass the circuit structure referred as the super transconductance structure which has an extreme amplifying ratio. Since only the low-frequency main poles of the output of the error amplifier EA are kept without introducing new low-frequency poles, the bandwidth is broadened while the gain is improved.

Figure 1:
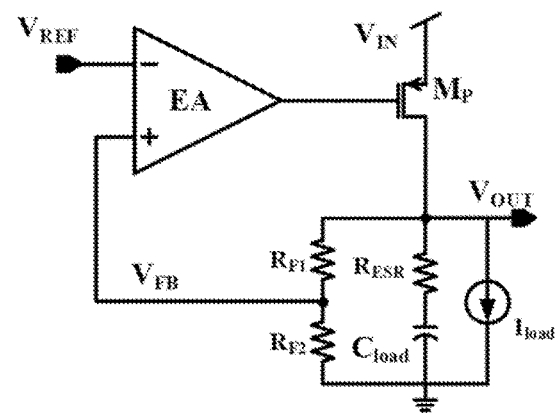
FIG. 1 is a structural diagram of typical low dropout linear regulator LDO.
Figure 2:
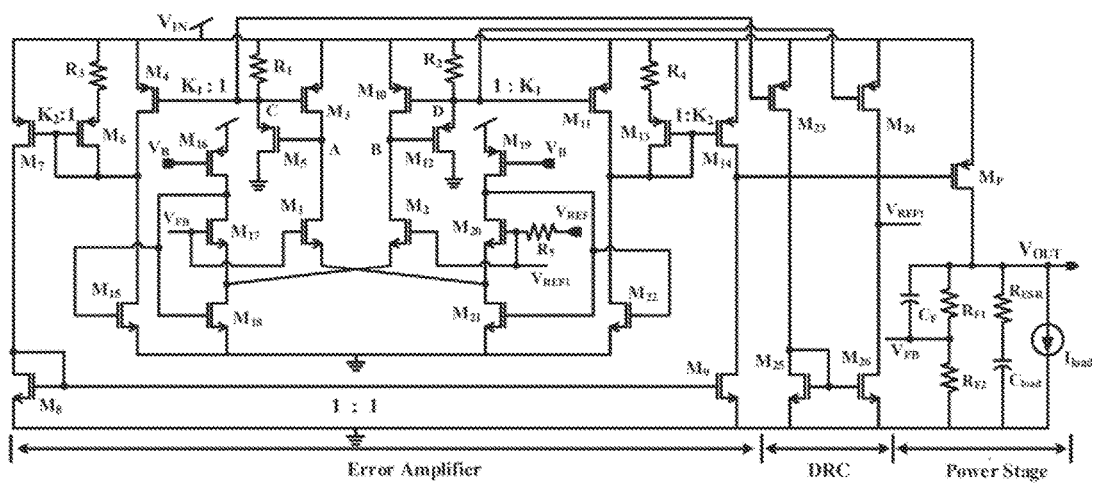
FIG. 2 is a complete circuit diagram of the low dropout linear regulator with super transconductance structure proposed by the present invention.

FIG. 2 is a complete circuit diagram of the low dropout linear regulator with super transconductance structure proposed by the present invention, including a resistor feedback network which is used to generate a feedback voltage $V_{FB}$. The resistor feedback network is made of a first feedback resistor $R_{F1}$ and a second feedback resistor $R_{F2}$ in series. The voltage of the series point is a feedback voltage $V_{FB}$. The other end of the first feedback resistor $R_{F1}$ is connected to an output terminal. The other end of the second feedback resistor $R_{F2}$ is grounded. An adjustment transistor $M_P$ is a power transistor. The drain of the adjustment transistor is connected to the output terminal. The source of the adjustment transistor is connected to a power supply. The adjustment transistor is used to adjust the output voltage $V_{OUT}$. An error amplifier is a transconductance amplifier using a super transconductance structure. The error amplifier is used to sample the errors of the dynamic reference voltage $V_{REF1}$ and the feedback voltage $V_{FB}$ and to amplify the errors to output to the adjustment transistor $M_P$ to adjust the gate voltage of the adjustment transistor $M_P$. The input pair transistors of the error amplifier include the first NMOS transistor $M_1$ and the second NMOS transistor $M_2$. The gates of the first NMOS transistor $M_1$ and the second NMOS transistor $M_2$ are used as the input port of the error amplifier. The gate of the first NMOS transistor $M_1$ is connected to the feedback voltage $V_{FB}$. The gate of the second NMOS transistor $M_2$ is connected to the dynamic reference voltage $V_{REF1}$. The dynamic reference module is used to increase the SR current of the output of the error amplifier EA during the load transit change. The compensation capacitor $C_F$ is connected in parallel to tow ends of the first feedback resistor $R_{F1}$ to improve the phase margin. A load current source $I_{load}$ is connected between a drain of the adjustment transistor $M_P$ and ground. An output capacitor $C_{load}$ and its equivalent resistor $R_{ESR}$ are connected in series. An end of the output capacitor $C_{load}$ is grounded, and the other end is connected to the drain of the adjustment transistor through the equivalent resistor.

The error amplifier further includes a first PMOS transistor $M_3$ and a second PMOS transistor $M_4$, a sixth PMOS transistor $M_{10}$ and a seventh PMOS transistor $M_{11}$ that form a first-stage current mirror, which is used to amplify the small signal current with the amplification factor $K_1$. A drain of the first PMOS transistor $M_3$ is connected to a drain of the first NMOS transistor $M_1$. The gates of the first PMOS transistor $M_3$ and the first NMOS transistor $M_1$ are connected together. The sources of the first PMOS transistor $M_3$ and the second PMOS transistor $M_4$ are both connected to the power supply. A drain of the sixth PMOS transistor $M_{10}$ is connected to a drain of the second NMOS transistor $M_2$. The gates of the sixth PMOS transistor $M_{10}$ and the seventh PMOS transistor $M_{11}$ are connected together. The sources of the sixth PMOS transistor $M_{10}$ and the seventh PMOS transistor $M_{11}$ are both connected to the power supply. A fourth PMOS transistor $M_6$, a fifth PMOS transistor $M_7$, a ninth PMOS transistor $M_{13}$, and a tenth PMOS transistor $M_{14}$ form a second-stage current mirror, which is used to further amplify the small signal with the amplification factor $K_2$. A drain of the second PMOS transistor $M_4$ is connected to a drain of the fourth PMOS transistor $M_6$. The gate and the drain of the fourth PMOS transistor $M_6$ are connected together to connected to the gate of the fifth PMOS transistor $M_7$. The source of the fifth PMOS transistor $M_7$ is connected to the power supply. A drain of the seventh PMOS transistor $M_{11}$ is connected to a drain of the ninth PMOS transistor $M_{13}$. The gate and a drain of the ninth PMOS transistor $M_{13}$ are connected together to a gate of the tenth PMOS transistor $M_{14}$. A source of the tenth PMOS transistor $M_{14}$ is connected to the power supply. A third NMOS transistor $M_8$ and a fourth NMOS transistor $M_9$ form a current mirror. A drain of the fifth PMOS transistor $M_7$ is connected to a drain of the third NMOS transistor $M_8$. A drain and a gate of the third NMOS transistor $M_8$ are connected together to further connected to a gate of the fourth NMOS $M_9$. A drain of the fourth NMOS transistor $M_9$ is connected to a drain of the tenth PMOS transistor $M_{14}$. The sources of the third NMOS transistor $M_8$ and the fourth NMOS transistor $M_9$ are grounded. A drain of the fourth NMOS transistor $M_9$ and a drain of the tenth PMOS transistor $M_{14}$ as the output of the error amplifier are connected to the gate of the adjustment transistor $M_P$. The outputs of the drain of the fourth NMOS transistor $M_9$ and the drain of the tenth PMOS transistor $M_{14}$ that are small signal currents are summed up to adjust the gate of the adjustment transistor $M_P$.

A first NMOS transistor $M_1$ and a second NMOS transistor $M_2$ are a differential input pair of the error amplifier EA. The difference of the dynamic reference voltage $V_{REF1}$ and the feedback voltage $V_{FB}$ is sampled. The feedback signal $V_{FB}$ is converted to small signal current. The feedback signal $V_{FB}$ is converted to small signal current through the input pair. One branch goes through the first NMOS transistor $M_1$, the first PMOS transistor $M_3$, the second PMOS transistor $M_4$, the fourth PMOS transistor $M_6$, the fifth PMOS transistor $M_7$, the third NMOS transistor $M_8$, the fourth NMOS transistor $M_9$ to the error amplifier EA output. Another branch goes through the second NMOS transistor $M_2$, the sixth PMOS transistor $M_{10}$, the seventh PMOS transistor $M_{11}$, the ninth PMOS transistor $M_{13}$, the tenth PMOS transistor $M_{14}$ to the error amplifier EA output. The signals of the two branches are summed up here to jointly adjust the gate voltage of the adjustment transistor $M_P$. The signal flow is amplified by $K_1$ times under the effect of the first-stage current mirror which is made up by the first PMOS transistor $M_3$, the second PMOS transistor $M_4$, the sixth PMOS transistor $M_{10}$, and the seventh PMOS transistor $M_{11}$. The signal flow is amplified by about $K_2$ times under the effect of the second-stage current mirror which is made up by the fourth PMOS transistor $M_6$, the fifth PMOS transistor $M_7$, the ninth PMOS transistor $M_{13}$, the tenth PMOS transistor $M_{14}$. A small signal goes through this step-by-step amplification and finally gains a great equivalent transconductance. The fifth NMOS transistor $M_{15}$ and the tenth NMOS transistor $M_{22}$ act as a bias current source. Thus, the bias current is prevented from being amplified step by step. Therefore, the increase of static power consumption is avoided. $C_F$ is a usual feedforward capacitor and is used to improve the phase margin. In addition, $C_{load}$ and $I_{load}$ are the output capacitor and the load current respectively and are connected to the output $V_{out}$ directly. The structure is the same as that of typical LDO.

Figure 3:
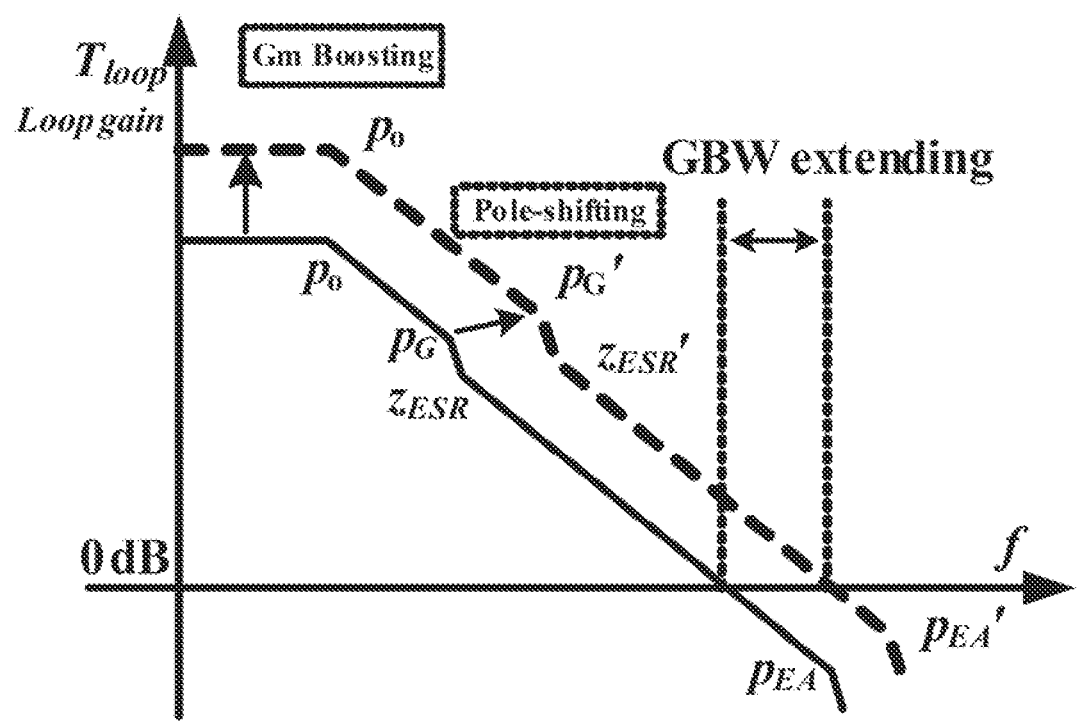
FIG. 3 is a comparison diagram of the loop gain and amplitude-frequency characteristic curve of the low dropout linear regulator with super transconductance structure proposed by the present invention versus the general low dropout linear regulator.

As shown, FIG. 3 is a comparison diagram of the loop gain and amplitude-frequency characteristic curve of the low dropout linear regulator with super transconductance structure proposed by the present invention versus the general low dropout linear regulator. By increasing the transconductance, the loop gain is increased without introducing low-frequency zeros or poles. The effect of expanding bandwidth is achieved. The solid line part of FIG. 3 represents the LDO loop gain without the super transconductance structure. $P_O$ represents the output main pole of the LDO. $P_G$ represents the output of the error amplifier EA (the gate of the $M_P$). $Z_{ESR}$ represents the zeros in the left half plane that is compensated by ESR. The dashed line represents the LDO loop gain with the super transconductance structure. It can be seen that the increase of the loop gain caused by the increase of transconductance significantly extends the bandwidth and ensures the stability.

The present invention utilizes a super transconductance structure to extend the bandwidth. If the current mirror ratio is increased, the bandwidth can be greatly expanded. However, at the same time, the current mirror gate capacitance is increased, and the original high-frequency poles move towards the low frequency. If the poles are close to the position of unity-gain bandwidth, the stability problems are likely to be caused. Therefore, the expansion of the bandwidth is limited by the poles of different orders introduced by current mirrors. The present invention provides two new type of broad-bandwidth current amplifiers. The new type of broad-bandwidth current amplifiers only introduce poles of higher frequency while ensuring the current gain. Thus, the introduction of additional lowfrequency poles is avoided when super transconductance structure is used. Hence, the problem of stability is solved.

As shown in FIG. 2, in the error amplifier EA, the first PMOS transistor $M_3$, the second PMOS transistor $M_4$, the third PMOS transistor $M_5$, and the first resistor $R_1$ form the first new type of broad-bandwidth current amplifier. The sixth PMOS transistor $M_{10}$, the seventh PMOS transistor $M_{11}$, an eighth PMOS transistor $M_{12}$, and the second resistor $R_2$ also form the first new type of broad-bandwidth current amplifier. The gate of the third PMOS transistor $M_5$ is connected to the drain of the first PMOS transistor $M_3$. The gate of the eighth PMOS transistor $M_{12}$ is connected to the drain of the sixth PMOS transistor $M_{10}$. The source of the third PMOS transistor $M_5$ is connected to the gate of the first PMOS transistor $M_3$. The source of the eighth PMOS transistor $M_{12}$ is connected to the gate of the sixth PMOS transistor $M_{10}$. The drains of the third PMOS transistor $M_5$ and the eighth PMOS transistor $M_{12}$ are grounded. The first resistor $R_1$ is connected between a source of the third PMOS transistor $M_5$ and the power supply. The second resistor $R_2$ is connected between a source of the eighth PMOS transistor $M_{12}$ and the power supply. The third resistor $R_3$, the fourth PMOS transistor $M_6$, and the fifth PMOS transistor $M_7$ form the second new type of high bandwidth current amplifier. The fourth resistor $R_4$, the ninth PMOS transistor $M_{13}$, and the tenth PMOS transistor $M_{14}$ also form the second new type of broad-bandwidth current amplifier. The third resistor $R_3$ is connected between the power supply and a source of the fourth PMOS transistor $M_6$. The fourth resistor $R_4$ is connected between a source of the ninth PMOS transistor $M_{13}$ and the power supply.

Figure 4A:
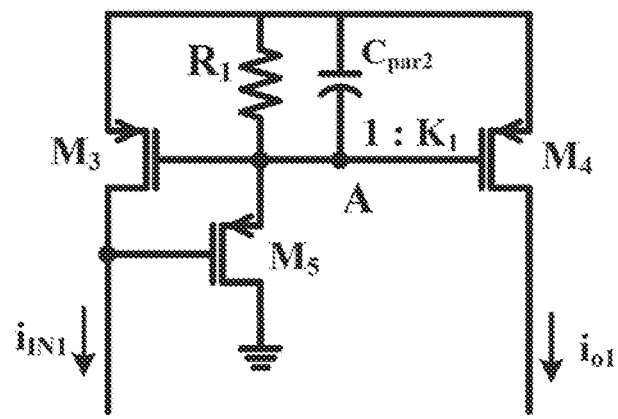
FIG. 4A is a schematic circuit diagram of a first new type of high bandwidth current amplifier in the low dropout linear regulator with super transconductance structure proposed by the present invention.
Figure 4B:
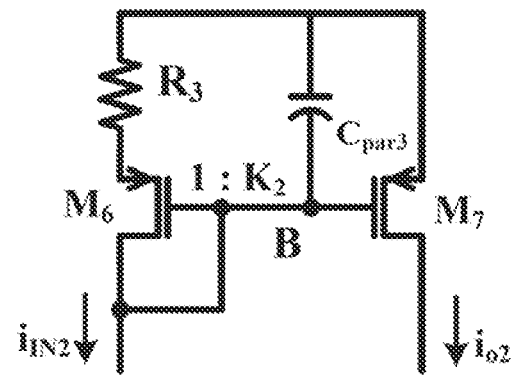
FIG. 4B is a schematic circuit diagram of a second new type of high bandwidth current amplifier in the low dropout linear regulator with super transconductance structure proposed by the present invention.

The specific circuits of the two new types of broad-bandwidth current amplifiers are shown in FIG. 4A and FIG. 4B.

FIG. 4A is a schematic circuit diagram of a first new type of high bandwidth current amplifier in the low dropout linear regulator with super transconductance structure proposed by the present invention. Based on the general current mirror structure, the first resistor $R_1$ and the first PMOS transistor $M_3$ are added. The formula of the gain for the small signal current is:

$$K_i(s) = \frac{K_i}{1 + (g_{m1}r_{o1}) \cdot g_{m3}/C_{par2}s}$$

In the formula, $K_i$ is the ratio of the aspect ratio of the $i^{th}$ current mirror. Here, $K_i$ is the ratio of the aspect ratio of the second PMOS transistor $M_4$ to the first PMOS transistor $M_3$. Thus, the node impedance of point A goes down from the original $(1/g_{m1})$ to $(1/g_{m1}r_{o1}g_{m3})$. The pole of point A moves towards the higher frequency by $g_{m3}r_{o1}$ times.

FIG. 4B is a schematic circuit diagram of a second new type of high bandwidth current amplifier in the low dropout linear regulator with super transconductance structure proposed by the present invention. The second resistor $R_2$ is connected in series to the input transistor of the general current mirror. The formula of the gain of small signal current is:

$$K_i(s) = \left(\frac{g_{m5}}{g_{m4}} + g_{m5}R_2\right)\frac{1}{1 + s/(1/g_{m4} + R_2)C_{par3}}$$

Under the same gain requirement, due to the insertion of the second resistor $R_2$, a relatively small $g_{m5}/g_{m4}$ can be taken. That is, the area of $M_5$ is reduced equivalently. The parasitic capacitance of the node B is reduced. It is beneficial to push the poles toward the higher frequency.

In order to improve the transient response of the LDO, the invention uses a dynamic bias circuit.

In FIG. 2, in the error amplifier EA, the first NMOS transistor $M_1$, the second NMOS transistor $M_2$, the second NMOS transistor $M_{15}$, the eleventh PMOS transistor $M_{16}$, the sixth NMOS $M_{17}$, the seventh NMOS transistor $M_{18}$, the twelfth PMOS transistor $M_{19}$, the eighth NMOS transistor $M_{20}$, the ninth NMOS transistor $M_{21}$, the tenth NMOS transistor $M_{22}$ form the dynamic bias structure, the gate of the sixth NMOS transistor $M_{17}$ is connected to the feedback voltage $V_{FB}$, the gate of the eighth NMOS transistor $M_{20}$ is connected to the dynamic reference voltage $V_{REF1}$. The sources of the sixth NMOS transistor $M_{17}$ and the second NMOS transistor $M_2$ are connected to the drain of the seventh NMOS transistor $M_{18}$. The sources of the eighth NMOS transistor $M_{20}$ and the first NMOS transistor $M_1$ are connected to the drain of the ninth NMOS transistor $M_{21}$. The seventh NMOS transistor $M_{18}$ and the ninth NMOS transistor $M_{21}$ form the current mirror. The sources of the seventh NMOS transistor $M_{18}$ and the ninth NMOS transistor $M_{21}$ are grounded, the gate of the seventh NMOS transistor $M_{18}$ is connected to drains of the eleventh PMOS transistor $M_{16}$ and the sixth NMOS $M_{17}$ and the gate of the fifth NMOS transistor $M_{15}$, the gate of the ninth NMOS transistor $M_{21}$ is connected to drains of the twelfth PMOS transistor $M_{19}$ and the eighth NMOS transistor $M_{20}$ and the gate of the tenth NMOS transistor $M_{22}$. The drains of the fifth NMOS transistor $M_{15}$ and the tenth NMOS transistor $M_{22}$ are connected to drains of the second PMOS transistor $M_4$ and the seventh PMOS transistor $M_{11}$. The sources of the fifth NMOS transistor $M_{15}$ and the tenth NMOS transistor $M_{22}$ are grounded. The sources of the eleventh PMOS transistor $M_{16}$ and the twelfth PMOS transistor $M_{19}$ are connected to the power supply. The gates of the eleventh PMOS transistor $M_{16}$ and the twelfth PMOS transistor $M_{19}$ are connected to the bias voltage.

In the case of the steady state, the feedback voltage $V_{FB}$ and the dynamic reference voltage $V_{REF1}$ are equal. Due to the symmetrical relationship, the same current $I_B$ flows through the sixth NMOS transistor $M_{17}$, the eighth NMOS transistor $M_{20}$, the first NMOS transistor $M_1$, the second NMOS transistor $M_2$. The drain of the seventh NMOS transistor $M_{18}$ and the drain of the ninth NMOS transistor $M_{21}$ can be deemed as the AC ground. Thus, the function of the structure in the steady state is same as that of the differential pair structure with the tail current of $2I_B$.

In the case of the transient state, the dynamic bias structure has the effect of increasing the tail current. Detailed analysis is as below. Assuming that the load current $I_{load}$ suddenly increases, when the loop does not respond, the output voltage $V_{OUT}$ suddenly decreases, such that the feedback voltage $V_{FB}$, decreases accordingly. Since the current flowing through the sixth NMOS transistor $M_{17}$ is determined by the bias current of the eleventh PMOS transistor $M_{16}$, the source voltage of the sixth NMOS transistor $M_{17}$ will decrease accordingly. The current flowing through the second NMOS transistor $M_2$ will increase. Considering that the current of the seventh NMOS transistor $M_{18}$ has not changed yet, since the current flowing through the sixth NMOS transistor $M_{17}$ is equal to the current of the seventh NMOS transistor $M_{18}$ minus the current of the second NMOS transistor $M_2$, the current flowing through the sixth NMOS transistor $M_{17}$ will have a downward trend. The drain voltage of the sixth NMOS transistor $M_{17}$ will rise until the current flowing through the seventh NMOS transistor $M_{18}$ is equal to the sum of the current of the sixth NMOS transistor $M_{17}$ and the current of the second NMOS transistor $M_2$. Since the gate voltage of the seventh NMOS transistor $M_{18}$ is a self-adaptive process at this time, as long as it is not high enough to make the eleventh PMOS transistor $M_{16}$ enter into the linear region, the allowable current can be increased, which is different from the case where the general tail current source limits the available current. The current flowing through the seventh NMOS transistor $M_{18}$ is mirrored to the fifth NMOS transistor $M_{15}$ through the current mirror. At this time, the first NMOS transistor $M_1$, the first PMOS transistor $M_3$, and the second PMOS transistor $M_4$ are cut off. The final pull-down current $I_{M9}$ output by the error amplifier EA is approximately $K_2*I_{M15}$. The transient current $I_{M15}$ flowing through the fifth NMOS transistor $M_{15}$ is increased. At the same time, the transient current $I_{M9}$ is also increased. The negative slew rate ($SR-=I_{M9}/C_{PAR}$) increases, and thereby improving the transient response. In the invention, the error amplifier EA with the push-pull output is used. Therefore, the analysis process of the hopping from the heavy-load to the light load is the same. By increasing the current flowing through the ninth NMOS transistor $M_{21}$ and the tenth NMOS transistor $M_{22}$ in the transient state, the current $I_{M14}$ flowing through the tenth PMOS transistor $M_{14}$ increases. Thus, the positive slew rate ($SR+=I_{M14}/C_{PAR}$) increases, such that the transient response is improved. In summary, in the steady state, dynamic bias structure is the same as that of the general current source bias, in which a stable bias current is provided. In the transient state, dynamic bias structure can increase the required bias current to reach a higher SR current, so as to improve the transient response of the LDO.

In order to improve the transient response of the LDO, the present invention uses the dynamic reference control technology.

As shown in FIG. 2, the dynamic reference control module includes the thirteenth PMOS transistor $M_{23}$, the fourteenth PMOS transistor $M_{24}$, the eleventh NMOS transistor $M_{25}$, the twelfth NMOS transistor $M_{26}$, and the fifth resistor $R_5$. The eleventh NMOS transistor $M_{25}$ and the twelfth NMOS transistor $M_{26}$ form a current mirror. The drains of the eleventh NMOS transistor $M_{25}$ and the twelfth NMOS transistor $M_{26}$ are connected to drains of the thirteenth PMOS transistor $M_{23}$ and the fourteenth PMOS transistor $M_{24}$ respectively. The drain and the gate of the eleventh NMOS transistor $M_{25}$ are connected together to the gate of the twelfth NMOS transistor $M_{26}$. The sources of the eleventh NMOS transistor $M_{25}$ and the twelfth NMOS transistor $M_{26}$ are grounded. The thirteenth PMOS transistor $M_{23}$ and the fourteenth PMOS transistor $M_{24}$ form a current mirror. The thirteenth PMOS transistor $M_{23}$ and the fourteenth PMOS transistor $M_{24}$, the first PMOS transistor $M_3$ and the sixth NMOS transistor $M_{10}$ form two current mirrors. The gates of the thirteenth PMOS transistor $M_{23}$ and the fourteenth PMOS transistor $M_{24}$ are connected to the gates of the first PMOS transistor $M_3$ and the sixth NMOS transistor $M_{10}$ respectively. The sources of the thirteenth PMOS transistor $M_{23}$ and the fourteenth PMOS transistor $M_{24}$ are connected to the power supply. The drain of the fourteenth PMOS transistor serves as an output of the dynamic reference control module and outputs the dynamic reference voltage $V_{REF1}$. The drain of the fourteenth PMOS transistor is connected to the gate of second NMOS transistor $M_2$, the gate of the eighth NMOS transistor $M_{20}$, and is connected to the reference voltage $V_{REF}$ via the fifth resistor $R_5$.

The thirteenth PMOS transistor $M_{23}$ and the fourteenth PMOS transistor $M_{24}$ mirror the current of the first PMOS transistor $M_3$ and the sixth PMOS transistor $M_{10}$ respectively. In the steady state, the current flowing through the first NMOS transistor $M_1$ and the current flowing through the second NMOS transistor $M_2$ of the differential pair are equal. The current flowing through the first PMOS transistor $M_3$ and the current flowing through the sixth PMOS transistor $M_{10}$ are equal too. Thus, the current flowing through the thirteenth PMOS transistor $M_{23}$ and the current flowing through the fourteenth PMOS transistor $M_{24}$ are equal because of the mirror relationship of the eleventh NMOS transistor $M_{25}$ and the twelfth NMOS transistor $M_{26}$. Therefore, the dynamic reference voltage $V_{REF1}$ is a stable voltage. The current does not flow through the fifth resistor $R_5$. Thus, $V_{REF1}=V_{REF}$. During the transient change, assuming that the load current suddenly increases, the feedback voltage $V_{FB}$ abruptly decreases. The current flowing through the first NMOS transistor $M_1$ and the third PMOS transistor $M_3$ decreases. Thus, the current flowing through the thirteenth PMOS transistor $M_{23}$, the eleventh NMOS transistor $M_{25}$, and the twelfth NMOS transistor $M_{26}$ decreases. The current flowing through the second NMOS transistor $M_2$, the sixth PMOS transistor $M_{10}$, and the fourteenth PMOS transistor $M_{24}$ increases. Thus, the excess current flows from $V_{REF1}$ to $V_{REF}$. The following formula is satisfied:

$$V_{REF1}=V_{REF}+(I_{M24}-I_{M26})*R_5$$

Thus, $V_{REF1}$ will be slightly greater than $V_{REF}$. Then, the feedback voltage $V_{FB}$ is smaller than the dynamic reference voltage $V_{REF1}$. The increase of the dynamic reference voltage $V_{REF1}$ makes the voltage difference greater, such that at the error amplifier EA output, a larger forward SR current $I_{M14}$ is produced. Thus, the transient response is improved. Similarly, if the load current suddenly becomes smaller, $V_{REF1}$ will decrease. The error amplifier EA output will produce a larger negative SR current $I_{M9}$, such that the output slew rate of the error amplifier EA is increased. Thus, the LDO transient response is improved.

Figure 5:
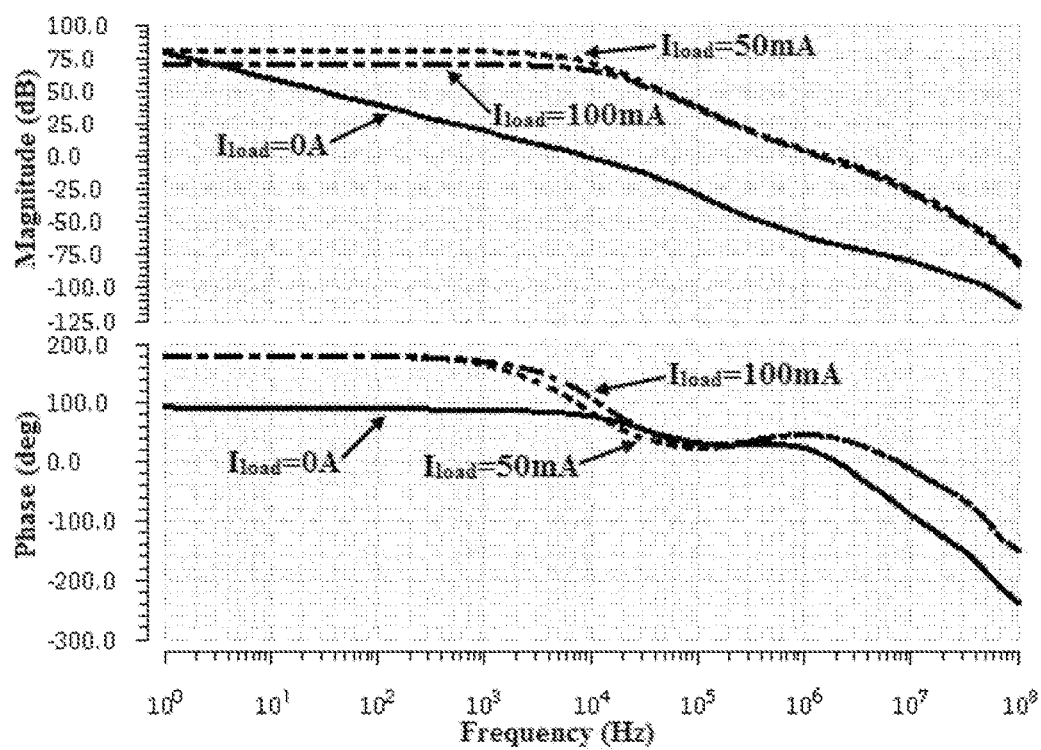
FIG. 5 is a simulation diagram of the loop gain of the low dropout linear regulator with super transconductance structure proposed by the present invention.

FIG. 5 is the simulation diagram of the loop gain and phase of LDO of the invention under different loads. When the load current is 50 mA and 100 mA, the unit gain bandwidth reaches 1.5 MHz and the phase margin is more than 45°. Thus, the loop is stable.

Figure 6:
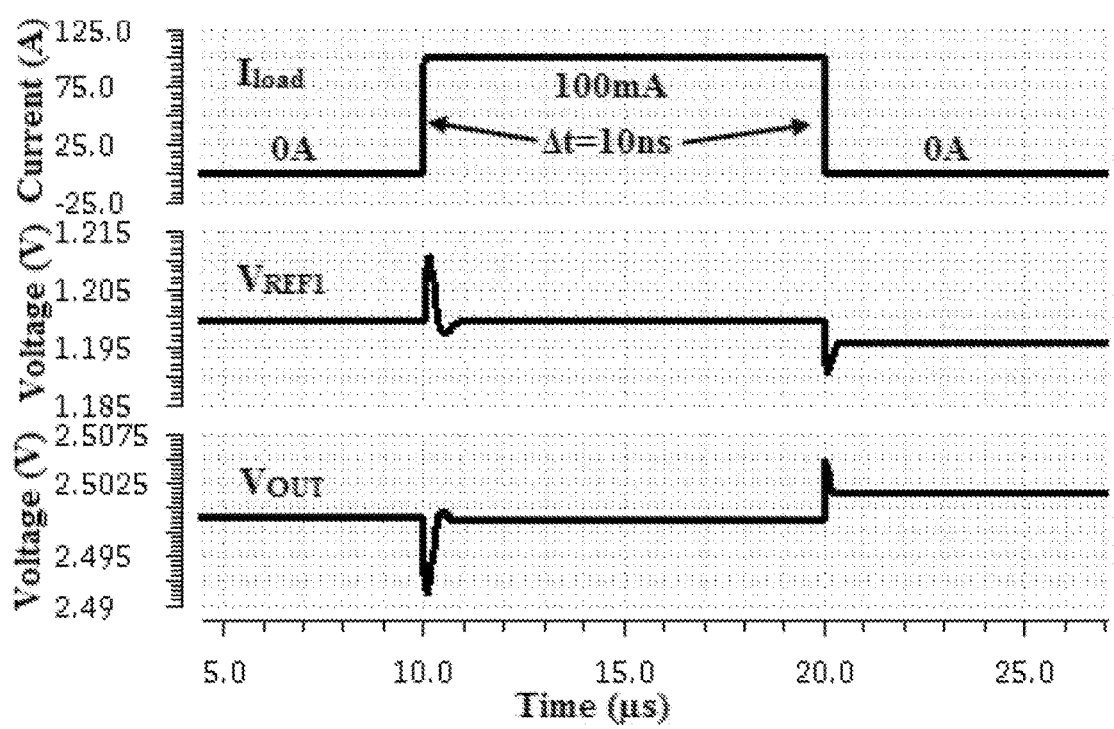
FIG. 6 is a transient response simulation diagram of the low dropout linear regulator with super transconductance structure proposed by the present invention.

FIG. 6 is the simulation diagram of the transient response of the LDO of the present invention. The load step amplitude is 100 mA. The hopping time is 10 ns. The maximum overshoot voltage is only 6.2 mV. The maximum undershoot voltage is only 7.8 mV.

Those skilled in the art will be able to make various other specific modifications and combinations which do not depart from the spirit of the invention in light of the technical teachings of the present invention, which are still within the scope of the present invention.

What is claimed is:

1. A low-dropout linear regulator with super transconductance structure comprising:
    a resistor feedback network, including a first feedback resistor and a second feedback resistor connected in series; wherein a voltage of a first end which is a series point of each of the first feedback resistor and the second feedback resistor is a feedback voltage; a second end of the first feedback resistor is connected to an output terminal; a second end of the second feedback resistor is grounded;
    an error amplifier, which is a transconductance amplifier with a super transconductance structure; wherein an input pair transistor of the error amplifier is composed of a first NMOS transistor and a second NMOS transistor; a gate of the first NMOS transistor and a gate of the second NMOS transistor serve as an input port of the error amplifier; and the gate of the first NMOS transistor is connected to the feedback voltage generated by the resistor feedback network;
    an adjustment transistor, which is a power transistor; wherein a drain of the adjustment transistor is connected to the output terminal; a source of the adjustment transistor is connected to a power supply; and a gate of the adjustment transistor is connected to an output terminal of the error amplifier;
    a dynamic reference control module, sampling an internal current change of the error amplifier and exporting a dynamic reference voltage to the gate of the second NMOS transistor in the error amplifier;
    a compensation capacitor, connected in parallel to both ends of the first feedback resistor;
    a load current source, connected between a drain of the adjustment transistor and ground; and
    an output capacitor, connected in series with an equivalent resistor; wherein a first end of the output capacitor is grounded; and a second end of the output capacitor is connected to the drain of the adjustment transistor through the equivalent resistor;
    wherein, the error amplifier further comprises a first PMOS transistor and a second PMOS transistor, a sixth PMOS transistor and a seventh PMOS transistor, forming a first-stage current mirror; wherein an amplification factor of the first-stage current mirror is $K_1$; a drain of the first PMOS transistor is connected to a drain of the first NMOS transistor; a gate of the first PMOS transistor and the gate of the first NMOS transistor are connected together; a source of the first PMOS transistor and a source of the second PMOS transistor are both connected to a power supply; a drain of the sixth PMOS transistor is connected to a drain of the second NMOS transistor; a gate of the sixth PIVIOS transistor and a gate of the seventh PMOS transistor are connected together; a source of the sixth PMOS transistor and a source of the seventh PMOS transistor are both connected to the power supply;
    a fourth PMOS transistor and a fifth PMOS transistor, a ninth PMOS transistor and a tenth PMOS transistor, forming a second-stage current mirror; wherein an amplification factor of the second current mirror is $K_2$; a drain of the second PMOS transistor is connected to a drain of the fourth PMOS transistor; a gate and a source of the fourth PMOS are connected together to a gate of the fifth PMOS; a source of the fifth PMOS transistor is connected to the power supply; a drain of the seventh PMOS transistor is connected to a drain of the ninth PMOS transistor; a gate and a drain of the ninth PMOS transistor are connected together to a gate of the tenth PMOS transistor; a source of the tenth PMOS transistor is connected to the power supply;
    a third NMOS transistor and a fourth NMOS transistor, forming a current mirror; wherein a drain of the fifth PMOS transistor is connected to a drain of the third NMOS transistor; a drain and a gate of the third NMOS transistor are connected together to a gate of the fourth NMOS transistor; a drain of the fourth NMOS transistor is connected to a drain of the tenth PMOS transistor and serve as the output terminal of the error amplifier; a source of the third NMOS transistor and a source of the fourth NMOS transistor are grounded;
    wherein
    the first PMOS transistor, the second PMOS transistor, a third PMOS transistor, and a first resistor form a first new type of broad-bandwidth current amplifier;
    the sixth PMOS transistor, the seventh PMOS transistor, an eighth PMOS transistor, and a second resistor form another first new type of broad-bandwidth current amplifier;
    a gate of the third PMOS transistor is connected to a drain of the first PMOS transistor;

a gate of the eighth PMOS transistor is connected to a drain of the sixth PMOS transistor;
a source of the third PMOS transistor is connected to a gate of the first PMOS transistor;
a source of the eighth PMOS transistor is connected to a gate of the sixth PMOS transistor;
a drain of the third PMOS transistor and a drain of the eighth PMOS transistor are grounded;
the first resistor is connected between a source of the third PMOS transistor and the power supply;
the second resistor is connected between a source of the eighth PMOS transistor and the power supply;
a third resistor, a fourth PMOS transistor, and a fifth PMOS transistor form a second new type of high bandwidth current amplifier;
a fourth resistor, a ninth PMOS transistor, and a tenth PMOS transistor form another second new type of broad-bandwidth current amplifier;
the third resistor is connected between the power supply and a source of the fourth PMOS transistor;
the fourth resistor is connected between the power supply and a source of the ninth PMOS transistor;
the first NMOS transistor, the second NMOS transistor, a fifth NMOS transistor, an eleventh PMOS transistor, a sixth NMOS transistor, a seventh NMOS transistor, a twelfth PMOS transistor, an eighth NMOS transistor, a ninth NMOS transistor, and a tenth NMOS transistor form a dynamic bias structure;
a gate of the sixth NMOS transistor is connected to the feedback voltage;
a gate of the eighth NMOS transistor is connected to the dynamic reference voltage;
a source of the sixth NMOS transistor and a source of the second NMOS transistor are connected to a drain of the seventh NMOS transistor;
a source of the eighth NMOS transistor and a source of the first NMOS transistor are connected to a drain of the ninth NMOS transistor;
the seventh NMOS transistor and the ninth NMOS transistor form a current mirror;
a source of the seventh NMOS transistor and a source of the ninth NMOS transistor are grounded;
a gate of the seventh NMOS transistor is connected to a drain of the eleventh PMOS transistor;
the gate of the seventh NMOS transistor is connected to a drain of the sixth NMOS transistor;
the gate of the seventh NMOS transistor is connected to a gate of the fifth NMOS transistor;
a gate of the ninth NMOS transistor is connected to a drain of the twelfth PMOS transistor;
the gate of the ninth NMOS transistor is connected to a drain of the eighth NMOS transistor;
the gate of the ninth NMOS transistor is connected to a gate of the tenth NMOS transistor;
a drain of the fifth NMOS transistor is connected to a drain of the second PMOS transistor;
a drain of the tenth NMOS transistor is connected to a drain of the seventh PMOS transistor;
a source of the fifth NMOS transistor and a source of the tenth NMOS transistor are grounded;
a source of the eleventh PMOS transistor and a source of the twelfth PMOS transistor are connected to the power supply; and
a gate of the eleventh PMOS transistor and a gate of the twelfth PMOS transistor are connected to the bias voltage.

2. The low-dropout linear regulator with super transconductance structure according to claim 1, wherein
the dynamic reference control module comprises a thirteenth PMOS transistor, a fourteenth PMOS transistor, an eleventh NMOS transistor, a twelfth NMOS transistor, and a fifth resistor;
the eleventh NMOS transistor and the twelfth NMOS transistor from a current mirror;
a drain of the eleventh NMOS transistor is connected to a drain of the thirteenth PMOS transistor;
a drain of the twelfth NMOS transistor is connected to a drain of the fourteenth PMOS transistor;
a drain and a gate of the eleventh NMOS transistor are connected together to a gate of the twelfth NMOS transistor;
a source of the eleventh NMOS transistor and a source of the twelfth NMOS transistor are grounded;
the thirteenth PMOS transistor and the fourteenth PMOS transistor, the first PMOS transistor and the sixth NMOS transistor in the error amplifier form two current minors;
a gate of the thirteenth PMOS transistor is connected to a gate of the first PMOS transistor;
a gate of the fourteenth PMOS transistor is connected to a gate of the sixth NMOS transistor;
a source of the thirteenth PMOS transistor and a source of the fourteenth PMOS transistor are both connected to the power supply;
a drain of the fourteenth PMOS transistor serves as an output terminal of the dynamic reference control module;
the drain of the fourteenth PMOS transistor outputs the dynamic reference voltage;
the drain of the fourteenth PMOS transistor is connected to the gate of the second NMOS transistor and the gate of the eighth NMOS transistor; and
the drain of the fourteenth PMOS transistor is connected to the reference voltage via the fifth resistor.

* * * * *